(12) United States Patent
Tse et al.

(10) Patent No.: US 6,212,668 B1
(45) Date of Patent: *Apr. 3, 2001

(54) GAIN MATRIX FOR HIERARCHICAL CIRCUIT PARTITIONING

(75) Inventors: John Tse, El Cerrito; Fung Fung Lee, Milpitas, both of CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/863,880

(22) Filed: May 27, 1997

Related U.S. Application Data
(60) Provisional application No. 60/018,410, filed on May 28, 1996.

(51) Int. Cl.[7] ................................................ G06F 17/50
(52) U.S. Cl. ............................. 716/7; 716/2; 716/8
(58) Field of Search ............................ 364/488, 489, 364/490, 491; 716/7, 2, 8

(56) References Cited

U.S. PATENT DOCUMENTS

| | | | |
|---|---|---|---|
| 4,617,479 | 10/1986 | Hartmann et al. | 365/185.17 |
| 4,791,590 | 12/1988 | Ku et al. | 708/404 |
| 4,871,930 | 10/1989 | Wong et al. | 326/39 |
| 4,903,107 | 2/1990 | Chan et al. | 257/647 |
| 4,918,379 | 4/1990 | Jongepier | 324/73.1 |
| 5,031,111 | 7/1991 | Chao et al. | 716/7 |
| 5,128,871 | 7/1992 | Schmitz | 716/17 |
| 5,187,671 | 2/1993 | Cobb | 716/12 |
| 5,218,551 | * 6/1993 | Agrawal et al. | 716/10 |
| 5,224,056 | 6/1993 | Chene et al. | 716/7 |
| 5,229,953 | 7/1993 | Isozaki et al. | 716/7 |
| 5,241,224 | 8/1993 | Pedersen et al. | 326/41 |
| 5,260,611 | 11/1993 | Cliff et al. | 326/39 |
| 5,305,229 | 4/1994 | Dhar | 703/14 |
| 5,309,371 | 5/1994 | Shikata et al. | 716/10 |

(List continued on next page.)

OTHER PUBLICATIONS

IEEE Transactions on Comuters, "Multiple–Way Network Partitioning", L.A. Sanchis, vol. 38, No. 1, Jan. 1989, pp. 62–81.*
Altera Corporation, 1995 Data Book, "MAX+Plus II, Programmable Logic Development System & Software," ver. 6, Mar. 1995, pp. 511–526.*
Altera Corporation, 199 Data Sheet, "FLEX 10K, Embedded Programmable Logic Family," ver. 1, Jul. 1995, pp. 1–56.*
Altera Corporation, 1995 Data Book, "FLEX 8000, Programmable Logic Device Family," ver. 6, Mar. 1995, pp. 37–115.*
Altera Corporation, 1995 Data Book, "MAX 9000, Programmable Logic Device Family," Mar. 1995 , pp. 117–152.*
B.W. Kernigham and S. Lin, "An Efficient Heuristic Procedure for Partitioning Graphs," The Bell Systems Technical Journal, Feb. 1970, pp. 291–307.*

Primary Examiner—Matthew Smith
Assistant Examiner—Vuthe Siek
(74) Attorney, Agent, or Firm—Townsend and Townsend and Crew LLP (57) ABSTRACT

A method for partitioning a group of cells in a network into a set of disjoint blocks of cells. The network is represented by a hierarchical graph with each level representing a hierarchy of resources, leaf nodes representing the blocks of cells, and edges representing interconnections between resources. A gain matrix is formed by combining a gain vector for each level of hierarchy for each possible move. Cells are moved between leaf nodes based on the gain matrix computed.

27 Claims, 7 Drawing Sheets

U.S. PATENT DOCUMENTS

| | | | |
|---|---|---|---|
| 5,311,443 | 5/1994 | Crain et al. | 716/10 |
| 5,341,308 | 8/1994 | Mendel | 716/7 |
| 5,359,538 | 10/1994 | Hui et al. | 716/9 |
| 5,392,227 | 2/1995 | Hiserote | 703/14 |
| 5,469,003 | 11/1995 | Kean et al. | 326/39 |
| 5,475,830 | 12/1995 | Chen et al. | 716/16 |
| 5,477,474 | 12/1995 | Southgate et al. | 703/15 |
| 5,485,396 | 1/1996 | Brasen et al. | 716/9 |
| 5,485,547 | 1/1996 | Maruno | 706/31 |
| 5,495,419 | 2/1996 | Rostoker et al. | 700/121 |
| 5,508,939 * | 4/1996 | Kim et al. | 716/7 |
| 5,513,124 | 4/1996 | Trimberger et al. | 716/7 |
| 5,519,629 * | 5/1996 | Snider | 716/17 |
| 5,521,836 * | 5/1996 | Hartoog et al. | 716/10 |
| 5,557,533 * | 9/1996 | Koford et al. | 716/9 |
| 5,574,893 * | 11/1996 | Southgate et al. | 703/17 |
| 5,696,503 * | 12/1997 | Nasburg | 340/933 |
| B1 4,617,479 | 9/1993 | Hartmann et al. | 365/185.17 |

\* cited by examiner

GAIN MATRIX FOR HIERARCHICAL CIRCUIT PARTITIONING

This application claims the benefit of Provisional Application Serial No. 60/018,410, filed May 28, 1996, and incorporated herein by reference.

BACKGROUND OF THE INVENTION

The present invention refers generally to graph partitioning, and more particularly, to partitioning a network of cells into disjoint blocks.

The problem of partitioning interconnected cells between limited resources is well known in the art. This problem arises in many areas. The task is to divide a number of cells, which have some type of interaction between them, among a number of resources. A goal is to minimize the cost of the interaction between the cells. The cost may be measured by a variety of values, depending upon the nature of the network. The cost of the interactions is often referred to as the cutsize.

For example, in the area of circuit partitioning for integrated circuits, discrete logic functions may be allocated to specific logic elements. The connections between different logic elements require the use of interconnect resources such as conductive wires. By minimizing the number of interconnections required between logic elements, the total number of wires needed for a particular design may be reduced. This allows a larger design to fit into a smaller area. The cost of this network may be measured by the number of interconnections needed.

Another area, for example, in which partitioning may be used is in parallel processing. Some parallel processing applications require that a large number of individual computations be assigned to a smaller number of processors. However, often the individual computations depend on results from other computations. This requires the processors to communicate. These communications slow down the speed in which the calculation can be completed. The cost of this network may be measured by the amount of time spent communicating. It is desirable to allocate the computations to processors such that the communication costs are minimal. Many other applications for this invention may be readily apparent to one skilled in the art.

The problem of graph partitioning has been extensively considered in the literature. See, for example, B. W. Kernighan and S. Lin, "*An Efficient Heuristic Procedure For Partitioning Graphs*", and Laura A. Sanchis, "*Multiple-Way Network Partitioning*", both of which are incorporated herein by reference for all purposes. Traditionally, in order to solve a network partitioning problem, the network has been described as a hierarchical graph. Each node in the graph represents a possible resource and each edge connecting the nodes represents a possible interconnection between the resources. The graph is a hierarchical graph wherein each node contains zero or more subnodes (its children or descendants) but can only be a descendant of one other node (its parent or ancestor.) The cells (i.e., those items which are to be assigned to the resources) are only placed in leaf nodes. Leaf nodes are those nodes at the lowest level of the graph. By definition, leaf nodes have no descendants.

Figure 2:
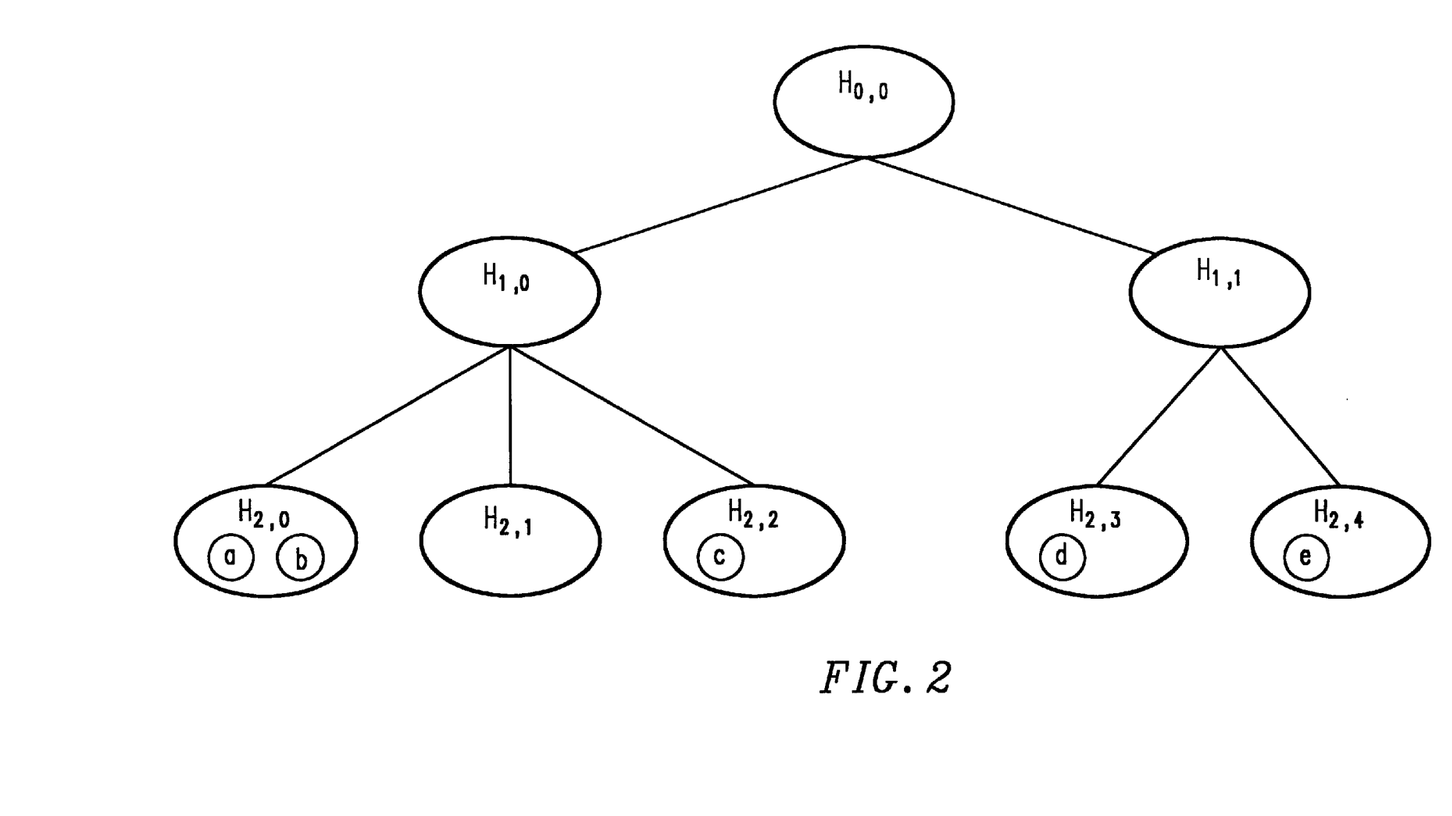
FIG. 2 depicts a three level hierarchal graph.

A typical three-level hierarchical graph is depicted in FIG. 2. Each level of the graph depicts a different level of hierarchy. For example, in the case of circuit partitioning, the $H_{0,0}$ node may refer to the entire network; whereas, the $H_{2,0}$ node may be a particular group of logic elements within the network. The cells, for example cells a and b in the $H_{2,0}$ node, may refer to particular logic elements. The subscripts in the node references are given to simplify discussion of particular nodes and are representative of the level of the node and a node number within that level.

As described above, the objective of partitioning is to place all the cells legally into the graph such that the interconnections among the nodes are minimized. This has traditionally been done using gain vectors. By this traditional method, a gain vector may be calculated for each possible move of each cell. A gain vector contains information of the change in number of interconnections (i.e., cutsize) in the graph due to moving a particular cell. A first entry in the gain vector represents the change in the cutsize that would be realized if the cell were moved. The second entry represents the likely change in cutsize from a subsequent cell move if the cell were moved now. For example, it assumes the current move has been made, and then determines what the next probable move would be and how that move will affect the cutsize. In other words, it does a lookahead estimation which predicts how future cell moves will be affected by moving the cell. The number of entries in the gain vector is dependant how many levels of lookahead are desired.

Values for the gain vectors are calculated and the cell with the best gain vector may be moved. The gain vectors are then recalculated and the procedure is repeated for the remaining cells. This may continue until a desirable partition is found. This method is described in the Sanchis reference cited above.

A limitation of the traditional method is that it does not take into account the effect at all hierarchal levels. It is only a two level approach and therefore will not find the move that will be the best from a global standpoint. It is therefore desirable to find a method which will place all cells into a block such that the costs are minimized for all levels of the design. An improved method for graph partitioning is therefore desirable.

SUMMARY OF THE INVENTION

A method is provided for partitioning a network of cells into a plurality of disjoint blocks of cells. The network may be represented as a hierarchical graph. Gain vectors may be calculated for multiple levels of the graph. A gain matrix is formed from the gain vectors. The cells are assigned to the disjoint blocks of cells using the gain matrices.

In an embodiment of the present invention, the gain vectors are calculated for a particular level using a subgraph of the hierarchical graph. The subgraph may be a two-level graph comprising the nodes of the hierarchical graph at the particular level being considered.

In an embodiment of the present invention, after an initial partition is made, a gain matrix is created for each potential move of each cell. Values of these gain matrices are calculated and compared. A best move cell may be selected and moved based on the values. The cell that was moved may then be locked and the process repeated for the remaining unlocked cells.

In an embodiment of the present invention, the gain matrices are compared by calculating a value for each gain matrix. The value may be a sum of all entries in the gain matrix. Alternatively, the gain matrix may be multiplied by a weight matrix and then summed.

A further understanding of the nature and advantages of the inventions presented herein may be realized by reference to the remaining portions of the specification and the attached drawings.

DESCRIPTION OF THE SPECIFIC EMBODIMENTS

Figure 1A:
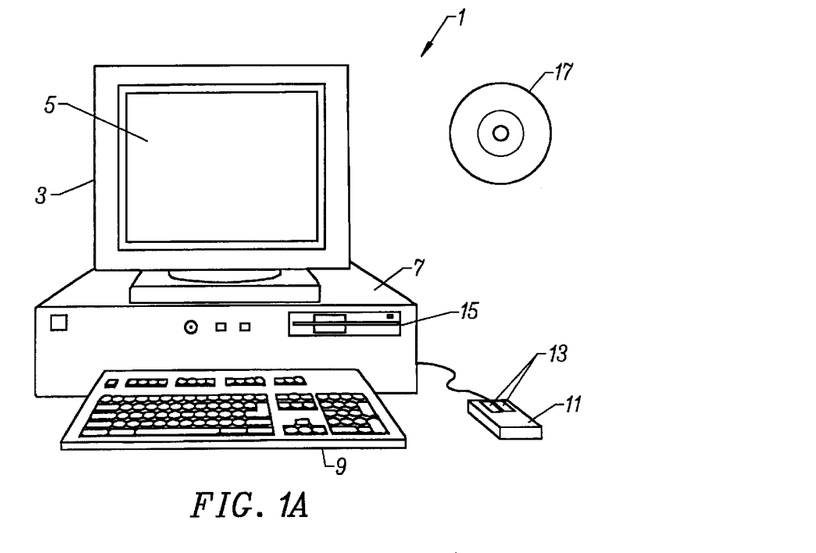
FIG. 1A illustrates an example of a computer system that may be used to execute software embodiments of the present invention.

FIG. 1A illustrates an example of a computer system that may be used to execute software embodiments of the present invention. FIG. 1A shows a computer system 1 that includes a monitor 3, screen 5, cabinet 7, keyboard 9, and mouse 11. Mouse 11 may have one or more buttons such as mouse buttons 13. Cabinet 7 houses a CD-ROM drive 15 and a hard drive (not shown) that may be utilized to store and retrieve software programs from computer readable media including computer code incorporating the present invention. A CD-ROM 17 is shown as the computer readable medium, although it will be recognized that other computer readable media including floppy disks, DRAM, hard drives, flash memory, tape, and the like may be used. Cabinet 7 also houses familiar computer components (not shown) such as a processor, memory, and the like.

Figure 1B:
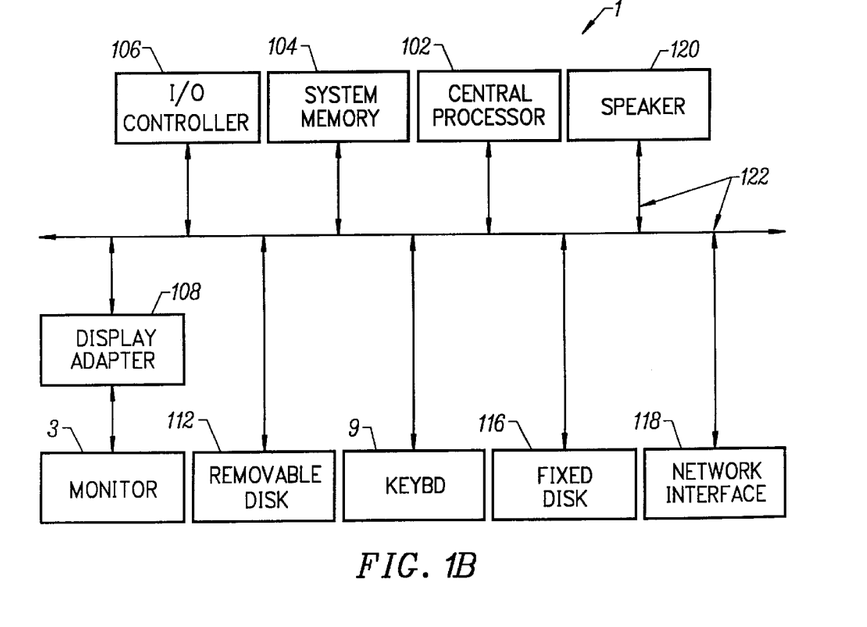
FIG. 1B shows a system block diagram of a typical computer system.

FIG. 1B shows a system block diagram of computer system 1 used to execute software embodiments of the present invention. As in FIG. 1A, computer system 1 includes monitor 3, and keyboard 9. Computer system 1 further includes subsystems such as a central processor 102, system memory 104, I/O controller 106, display adapter 108, removable disk 112, fixed disk 116, network interface 118, and speaker 120. Removable disk 112 is representative of removable computer readable media such as floppies, tape, CD-ROM, removable hard drives, flash memories, and the like. Fixed disk 116 is representative of an internal hard drive or the like. Other computer systems suitable for use with the present invention may include additional or fewer subsystems. For example, another computer system could include more than one processor 102 (i.e., a multiprocessor system) or memory cache.

Arrows such as 122 represent the system bus architecture of computer system 1. However, these arrows are illustrative of any interconnection scheme serving to link the subsystems. For example, display adapter 108 may be connected to central processor 102 through a local bus or the system may include a memory cache. Computer system 1 shown in FIG. 1B is but an example of a computer system suitable for use with the present inventions. Other configurations of subsystems suitable for use with the present invention will be readily apparent to one of ordinary skill in the art.

Figure 1C:
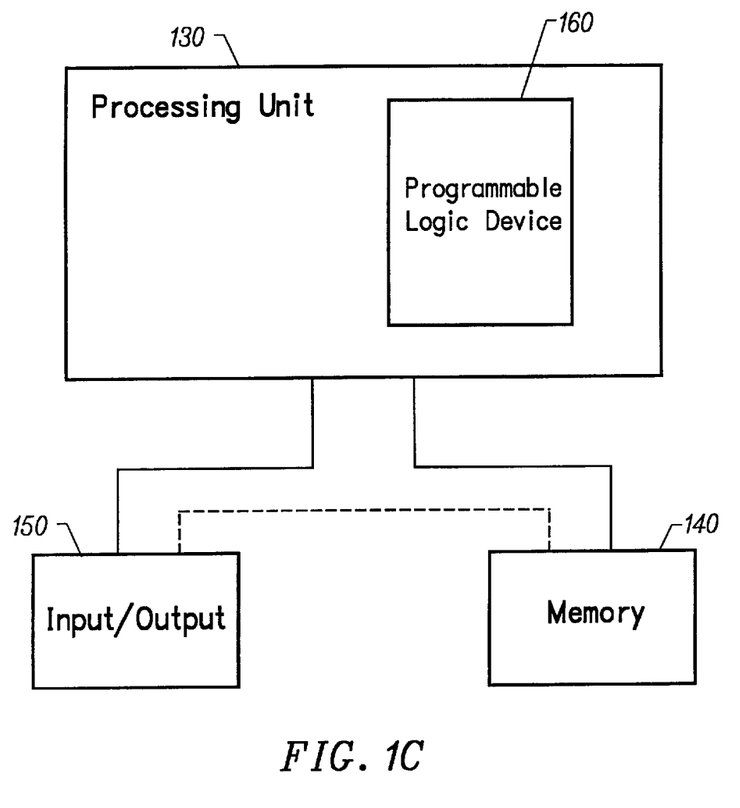
FIG. 1C is a block diagram of a digital system having a programmable logic device of the present invention.

FIG. 1C illustrates a typical environment in which a semiconductor device having been partitioned by the present invention may be embodied. A digital system has a processing unit 130 coupled with a memory 140 and an input/output device 150. A personal computer is an example of such a digital system. However, a wide variety of electronic and consumer products will find beneficial use from the present invention. The present invention will find application in telecommunications, switches, networks, and many other areas of technology.

The digital system of FIG. 1C contains one or more programmable logic devices 160 created by the methods described in the present invention. In FIG. 1C, programmable logic device 160 is shown as a part of processing unit 130. However, memory 140 or input/output device 150 may also contain programmable logic device 160.

The digital system shown may be embodied on a single board, on multiple boards, or even within multiple enclosures. Furthermore, the digital system may comprise any multiple or combination of the devices shown. For example, the digital system may have multiple processing units 130, or have no processing unit 130 at all. One of the advantages of programmable logic device 160 is it logical flexibility. Consequently, one with skill in the art can readily envision many applications for utilizing such a device within a variety of digital systems.

FIG. 2 depicts a hierarchical graph. The graph may be represented in software by a software construct. For example, a heap may be used to represent the graph. The graph describes possible interconnections between the resources of a network. Five cells (a, b, c, d, and e) are located in the nodes at the lowest level of hierarchy. The five cells are shown in the graph within leaf containers $H_{2,0}$, $H_{2,1}$, $H_{2,2}$, $H_{2,3}$, and $H_{2,4}$. The leaf containers, by definition, are those nodes in the graph which have no children. All cells are stored in leaf containers.

Node $H_{0,0}$ is the root node. The root node is the highest level in the hierarchy. As such, the root node has no parent nodes, but it has at least one child node. All other nodes in the network are descendants of the root node. Nodes $H_{1,0}$ and $H_{1,1}$ are at a lower level of hierarchy, and nodes $H_{2,0}$, $H_{2,1}$, $H_{2,2}$, $H_{2,3}$, and $H_{2,4}$ are at the lowest level of hierarchy. Each level of hierarchy corresponds to some type of hierarchy among the resources to be allocated. The lines between the nodes (known as edges) represent possible interconnections between the cells. This will be described in more detail below.

Although the techniques described in this specification are applicable to a variety of applications, in order to more easily understand the invention, it will be described using an example. However, the invention is not limited to this example. The example is the partitioning of logic elements of a programmable logic device to discreet blocks of logic elements known as logic array blocks.

Programmable logic devices have found particularly wide application in the industry. Their versatility, low design cost, and ease of use have combined to make these devices widely used in the designing of digital systems. Programmable logic devices (sometimes referred to as PLDs, PALs, PLAs, FPLAs, EPLDs, EEPLDs, LCAs, or FPGAs,) are well known integrated circuits that combine the advantages of fixed integrated circuits with the flexibility of custom-designed integrated circuits.

A distinguishing feature of a programmable logic device is the ability of a user to electronically program a standard, off-the-shelf part to perform logic functions to meet the user's individual needs. Their use is well-known in the industry and is described, for example, in U.S. Pat. No. 4,617,479, which is incorporated herein by reference for all purposes. Such devices are currently represented, for example, by Altera's MAX® series of PLDs and Altera's FLEX® series of embedded PLDs.

Figure 3:
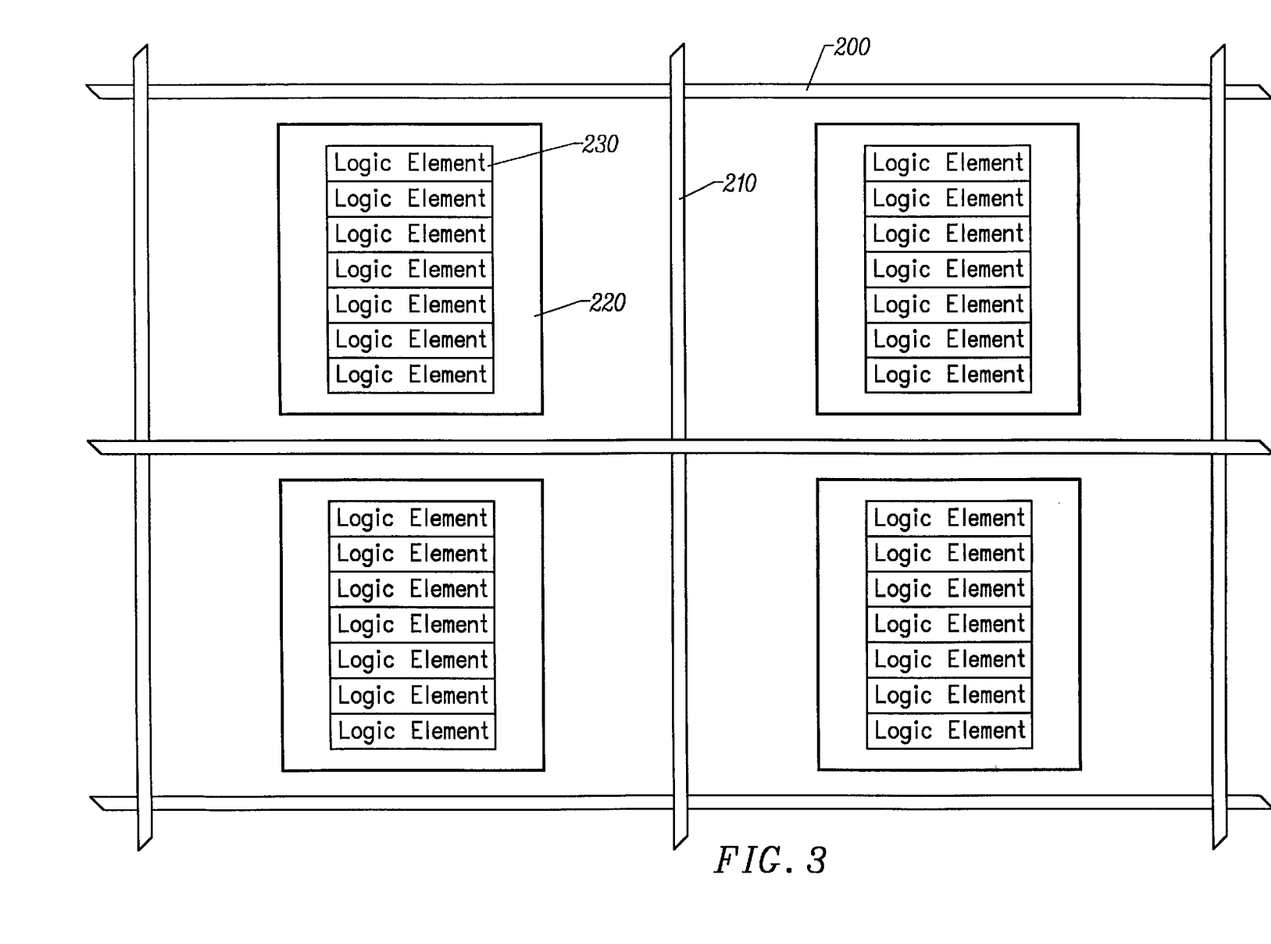
FIG. 3 is a block diagram of a typical programmable logic device.

FIG. 3 depicts a possible embodiment of a programmable logic device. It has a set of horizontal conductors 200, a set of vertical conductors 210, and several logic array blocks 220. Logic array blocks 220 may be located within a grid formed by horizontal conductors 200 and vertical conductors 210 as depicted in FIG. 3. Each logic array block 220 may have a set of logic elements 230 and local interconnections within it. Logic elements 230 may perform the actual logic function. Horizontal conductors 200 and vertical conductors 210 provide wires by which the logic elements 230 of different logic array blocks 220 may be electrically connected. The structure of horizontal conductors 200, vertical conductors 210, logic array blocks 220, and logic elements 230 are described more fully in, for example, Altera 1996 Data Book, *Flex 8K Programmable Logic Device Family*, pp. 93–153, which is incorporated herein by reference for all purposes.

FIG. 2 relates to FIG. 3 in the following manner. Cells a, b, c, d, and e of FIG. 2 correspond with logic elements 230 of FIG. 3. Logic elements 230 are located within logic array block 220. Logic array blocks 220 are represented by leaf nodes $H_{2,0}$, $H_{2,1}$, $H_{2,2}$, $H_{2,3}$, and $H_{2,4}$. In this example, logic array block 220 is the lowest level of hierarchy.

Each logic array block 220 is connected to horizontal conductors 200. In this example, for a connection to be made between a given logic array block 220 and another logic array block 220, a horizontal conductor 200 may be used. This is shown on the graph, for example, as the edge between nodes $H_{1,0}$ and $H_{2,0}$. The programmable logic device also has vertical conductors 210. Vertical conductors 210 provide connections between individual horizontal conductors 200. The edges depicted between root node $H_{0,0}$ and nodes $H_{1,0}$ and $H_{1,1}$ represent connections using the vertical conductor 210.

Accordingly, in the graph in FIG. 2, logic elements a and b are located within a common logic array block 220. Therefore, no horizontal conductors 200 or vertical conductors 210 are needed to form a connection between logic elements a and b. However, if a connection between logic element a and logic element c is desired, a horizontal conductor 200 may be used. This is easily seen in the graph of FIG. 2. The only path from node $H_{2,0}$ (which contains logic element a) to node $H_{2,3}$ (which contains logic element c) passes through node $H_{1,0}$ (which represents horizontal conductor 200.) The same is true of a connection between logic elements d and e, since a connection between them may pass through node $H_{1,1}$.

Connecting logic element a with logic element e may use both horizontal conductors 200 and vertical conductors 210. This is true because the only path from node $H_{2,0}$ (which represents the logic array block containing logic element a) and node $H_{2,4}$ (which represents the logic array block containing logic element e) passes through root node $H_{0,0}$.

A goal of partitioning the graph is to create the minimum number of interconnections between nodes in the same hierarchical level at all levels of the system. The number of interconnections is also known as the cutsize. For example, in circuit partitioning, the goal is to find an optimum placement of the logic within the logic array blocks to provide the minimum number of interconnections. This is often done with software. The cells may be placed in a node of the graph, and then moved to other nodes by the software until an optimal placement is found.

As discussed above, gain vectors have been used to determine which cell to move from one logic block to another during graph partitioning. However, this only optimizes the design at one level. The present invention introduces a gain matrix. A gain matrix is a set of gain vectors. The gain matrix takes into account the gain or loss in cutsize for multiple levels of the graph.

A gain matrix may be formed from the gain vectors at each level. The gain vector for a particular level may be calculated by creating a two-level subgraph. In the subgraph, it is assumed that the nodes at that particular level have no children and have the root node as a common parent. Cells which are contained in the leaf nodes below the level being considered are placed in the subgraph in the node which is their ancestor at the level being considered. In other words, each subgraph leaf node contains the elements which are in a leaf node which is a descendent of the node in the graph corresponding to that subgraph leaf node.

Once the subgraph has been created, the gain vectors may be calculated for each subgraph. An example of how to compute the gain matrix for the graph of FIG. 2 is described below with reference to FIG. 4 and FIG. 5.

Figure 4:
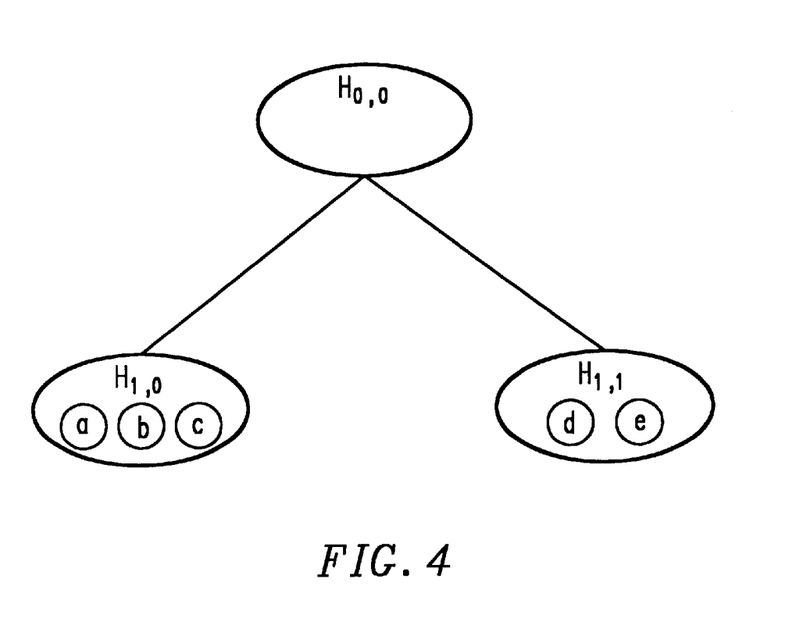
FIG. 4 depicts a subgraph used to compute the gain vector with respect to level one.

FIG. 4 shows a subgraph by which the gain vectors for level one are derived. In FIG. 4, node $H_{1,0}$ and node $H_{1,1}$ are assumed to be the subgraph leaf nodes. Logic element a and logic element b from node $H_{2,0}$ and logic element c from node $H_{2,2}$ are moved up to node $H_{1,0}$ of the subgraph since they are in nodes which are descendants of node $H_{1,0}$. The same is true with respect to node $H_{1,1}$ and logic element d and logic element e. Both nodes $H_{1,0}$ and $H_{1,1}$ are assumed to have a common parent which is root node $H_{0,0}$. The gain vectors for this subgraph V1 may be computed in a traditional manner using this subgraph and techniques such as those described in Sanchis. The number of lookahead values which are computed is dependant upon the application. In a preferred embodiment, six levels of lookahead are computed. However, some applications may utilize fewer or more levels of lookahead depending on computation power availability, time constraints, etc.

Figure 5:
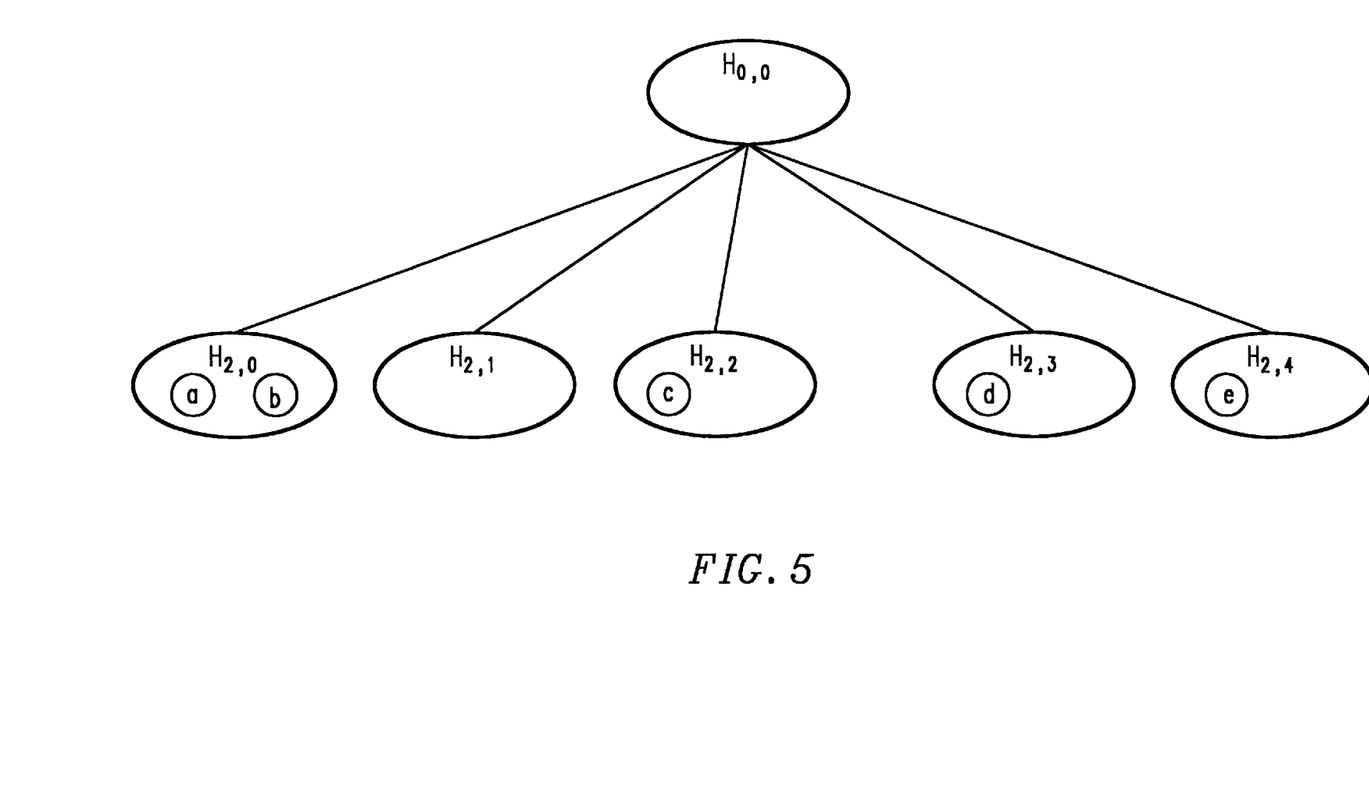
FIG. 5 depicts a subgraph graph used to compute the gain vector with respect to level two.

FIG. 5 depicts the subgraph used to determine the gain vector for a second level of the hierarchy. The nodes at the second level are all assumed to be leaf nodes. Since, in this case, they were the leaf nodes in the original graph also, the cells do not have to be moved up. Root node $H_{0,0}$ is assumed to be their common parent. The gain vector V2 for this subgraph may then be computed in the traditional manner. The gain matrix G for a given cell move will then be given by the equation: G=[V1, V2].

Figure 6:
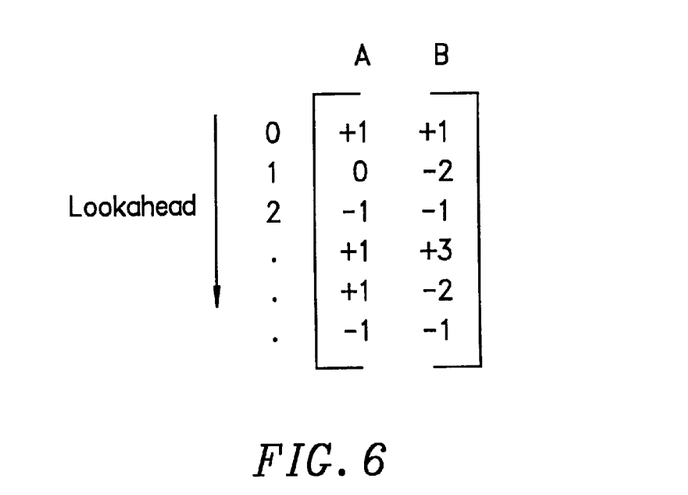
FIG. 6 is an example of a gain matrix for a possible move for the graph of FIG. 2.

An example of a possible gain matrix is given in FIG. 6. Column A is a gain vector for a level of the graph such as that shown in FIG. 4. The rows represent the different levels of lookahead. For example, row 0 is the entry corresponding to cost of the current move, row 1 is the entry corresponding to the cost of the next move, etc.

Figure 7:
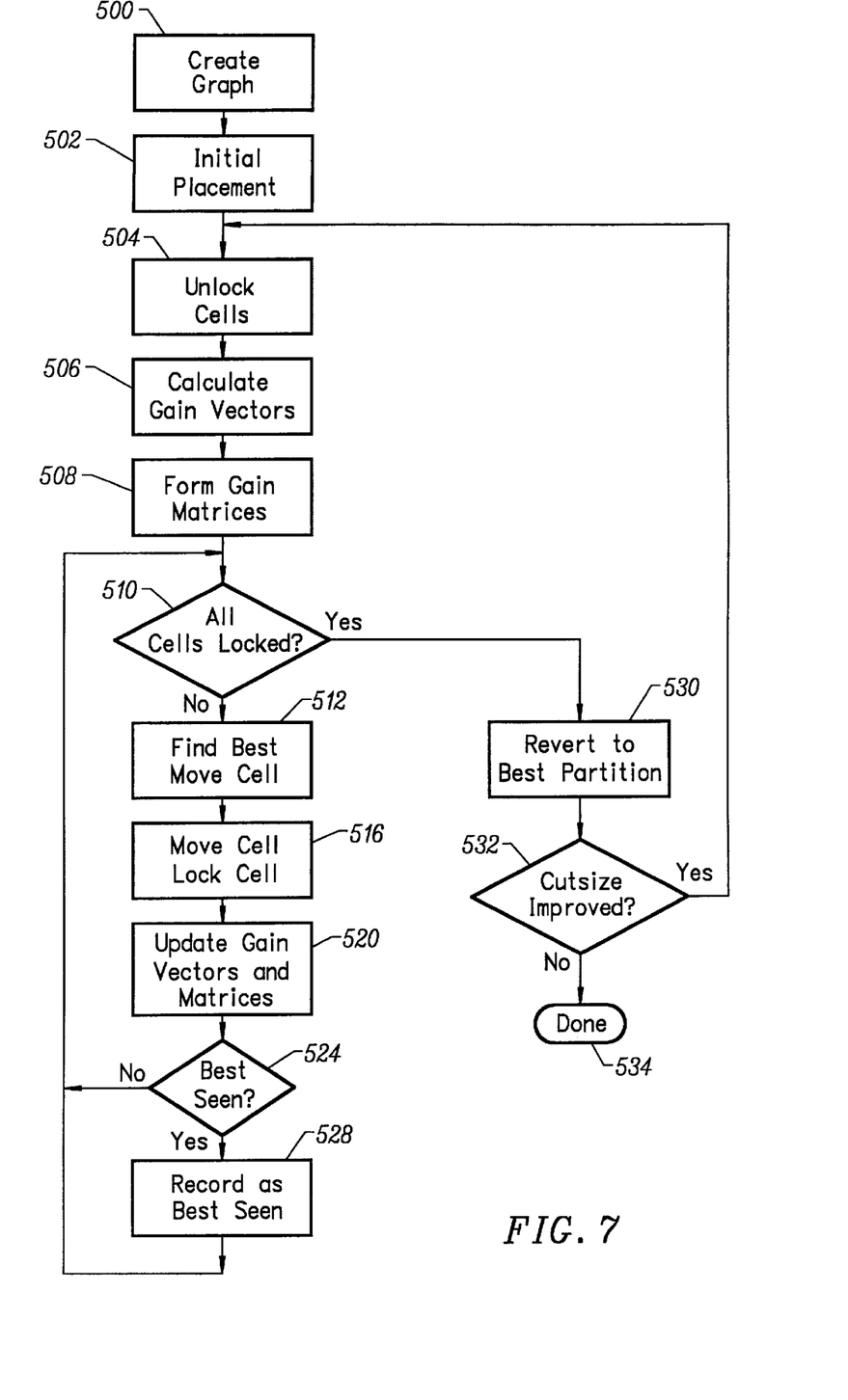
FIG. 7 depicts a flow chart of an algorithm for finding a partition using the present invention.

FIG. 7 shows a flow diagram of an example of a specific algorithm for implementing the present invention, although there are many other specific techniques. The algorithm is described in the context of the assignation of logic elements to logic array blocks in a programmable logic device. However, the invention is applicable to other networks in which cells are to be partitioned to disjoint blocks of cells.

A particular logic function may be described by the designer of a programmable logic device. This may be represented by a netlist describing the interconnections between the logic elements. The netlist may be generated, for example, by a computer software program. For example, Altera's MAX+PLUS II software, available from Altera Corporation in San Jose, CA, may generate the netlist from a description of the desired logic functions.

In step 500, a hierarchical graph is created with a root node representing the entire system. The resources are represented by nodes of the graph. These nodes are given a hierarchical order and nodes associated with a particular hierarchical level are placed at a common level of the hierarchical graph. A root node represents the highest level, while leaf nodes represent the lowest level. Non-leaf nodes represent one or more levels in between. Edges are placed on the graph between nodes of different levels to indicate that an interconnection is possible through the resource represented by a first node to the resource represented by a second node. Leaf nodes of the graph represent the lowest hierarchical level. In this example, the leaf nodes represent the logic array blocks of the programmable logic device.

In step 502, an initial partition of the logic elements is made. The logic elements are individually distributed to logic array blocks. That is, each logic element is placed by some algorithm into the leaf nodes. The distribution of the logic elements defines an initial partition. A simple algorithm may be used to quickly create the initial partition. It may or may not be a desirable partition. Even though the initial partition may not be a good partition, it is recorded as the best partition so far.

The initial partition may be created by a variety of algorithms. A preferred method uses a greedy algorithm. In a greedy algorithm, the logic elements may be assigned one at a time to the logic array block. Each logic element is assigned to the logic array block which increases the cutsize of the network by the smallest amount. Alternatively, rather than a greedy algorithm, the cells may be initially partitioned in a variety of different manners. For example, the logic elements may be randomly distributed among the logic array blocks.

A consideration in placing the logic elements into logic array blocks is the limit on the number of logic elements that can be placed in a logic element. This is generally a finite number, for example, eight. A placement or move is illegal if the addition of another logic element will exceed the maximum number of logic elements in the logic array block. The move is also illegal if its placement will exceed the number of interconnections available between logic array blocks. In a preferred embodiment, illegal placement is not allowed. However, in a second preferred embodiment, illegal placement is allowed, and the network is checked for legality after the partitioning is completed. This allows temporary illegalities to help in finding a best partition.

In step 504, a set of potential move cells is identified. In a preferred embodiment, initially all logic elements are potential move cells. A cell is said to be "locked" if it cannot be moved. Therefore the set of potential move cells are those cells which are unlocked. In a preferred embodiment, all of the cells are initially unlocked.

From this list of potential move cells, a list of potential moves is identified. Each potential move cell may be moved to many different logic array blocks.

In step 506, gain vectors are calculated for each possible move of each unlocked cell. A separate gain vector is calculated for each level using the subgraphs as described above.

The gain vectors for each level of hierarchy are combined in step 508 to form gain matrices. A gain matrix may be formed for each possible move. For example, a gain matrix may be formed for each legal move of each unlocked cell. Each gain matrix includes the gain vectors that were calculated for each subgraph.

Since, at this point, all cells are unlocked, the answer to decision 510 of whether all cells are locked will be "no." Therefore, according to the flow chart, the next step is step 512. In step 512, a best move cell is selected using the gain matrices. Many different algorithms may be used to determine the best move cell. The parameters of the system, the availability of resources and other considerations may be used to make the determination of how to select a best move cell.

In an embodiment of the present invention, an algorithm separately examines the value of the gain vectors in the gain matrix at each level starting at the highest level of hierarchy. If a gain vector at a level has a higher value than the others, it is selected as the best move. If more than one gain vectors have equally high values, then the next higher level of hierarchy is examined for those elements having equally high values. This is repeated until a best move is found. For a gain vector V with maximum lookahead m, the gain vector value is given by the equation:

$$V_a = \sum_{i=1}^{m} a_{ij}$$

A preferred embodiment analyzes the entire gain matrix at once, rather than one gain vector at a time. The best move is the one which has the highest value for its gain matrix. For a gain matrix G with a depth d and maximum lookahead m, the value is given by the equation:

$$G_a = \sum_{i=1}^{m} \sum_{j=1}^{d} a_{ij}$$

Another preferred embodiment uses a weighted function. In this method, a weight matrix W may be created with column entries representing weights for each level of lookahead, and rows representing weights for each level of hierarchy. For example, weight could correspond to the number of horizontal conductors 200 and vertical conductors 210 that are available. A separate weight may be entered for each combination of lookahead and level. The value of the weighted gain matrix GW is given by the equation:

$$GW_a = \sum_{i=1}^{m} \sum_{j=1}^{d} W_{ij} a_{ij}$$

Different algorithms may be used for the determination of W. For example, $W_{ij}$ may have different values for each level of hierarchy. In this case, the weighted sums of the gain vectors of the matrices are compared. In another embodiment, W is determined by the equation:

$$W_{ij} = r^{-i}$$

where r is a constant. This algorithm gives an exponential decay in the importance of lookahead gains. In other words, gains with smaller lookahead values are given exponentially more importance than gain with larger lookahead values.

The weights of the different levels in the weight matrix W may be dynamically adjusted throughout the process as resources become scarce or abundant. This method is advantageous because it allows the system resources to be dynamically allocated to maximize the usage of the resources. Of course, many other algorithms for determining a value for the gain matrices may be readily apparent to one of skill in the art.

After the best gain matrix is found, the cell corresponding to the best gain matrix is moved to the new destination as shown in step 516. The cell that was moved is then locked. This cell will not be moved again in this iteration of the process. Alternatively, the logic element may be left unlocked selectively to allow it to continue to be considered as a possible move cell. After moving the cell, the gain vectors and gain matrixes which have changed due to the cell move are updated in step 520.

In decision box 524, the partition is compared with the best partition found so far. If it is better (i.e., the partition has a smaller cutsize overall), the partition is recorded in step 528 as the best so far. If not, it is not recorded. The first time through, the initial partition will be the best so far.

Whether it was the best so far or not, the process moves next to decision box 510, again. The partition is examined to determine if all the cells are locked. If all the cells are not locked, then another pass is made through the process described above. Eventually, all of the cells will be locked. When all the cells are locked, the best partition that has been recorded is reverted to in step 530. Alternatively, the process may stop when a minimum number of elements are unlocked.

The best partition is compared with those found in previous iterations. If the cutsize has improved, then the cells are unlocked and another iteration is begun by unlocking all of the cells again. Once the cutsize stops improving then the algorithm is completed.

The following pseudocode is an example of a specific implementation of the present invention, although other implementations are possible.

Pseudocode
perform an initial placement to assign all cells to H;
for each level L, create gain vectors for level L;
create gain matrices from gain vectors;
while (cutsize has improved)

```
{
    unlock all cells;
    while (!all cells are locked)
    {
        find the best gain matrix G among all possible
            cell moves at leaf container level;
        move the corresponding cell C to the
            destination container specified by G;
        update gain vectors and gain matrices;
        if (new partition is legal and cutsize is the
            best seen so far)
        {
            record partition as the best partition;
        }
    }
    revert back to the best partition;
}
```

Although this invention has been described with reference to a particular embodiment, the application of this method is not limited only to the described embodiment. A person of skill in the art may find variations that do not depart from the spirit and scope of the present invention. For example, different types of networks may be partitioned, different algorithms for making the initial partition may be used, or different algorithms for determining the best gain matrix may be envisioned. Such variations are anticipated by the present invention. The scope of the present invention is intended to be limited only by the following claims.

What is claimed is:

1. A method of partitioning a network of cells into a plurality of disjont blocks of cells comprising:

representing said network as a hierarchial graph with a plurality of nodes at a first level and a plurality of nodes at a second level, the plurality of nodes at the first level being descendent from the plurality of nodes at the second level;

distributing the cells to said plurality of nodes at the first level to form an initial partition;

calculating a first gain vector for a first cell at said first level, the first gain vector representing a cost associated with moving the first cell from a first node of the plurality of nodes at the first level to a second node of the plurality of nodes at the first level;

calculating a second gain vector for said first cell as if the cells in the plurality of nodes on the first level were in their respective parent nodes at said second level, the second gain vector representing a cost associated with moving the first cell from a third node on the second level to a fourth node at the second level, wherein the first and second gain vectors form a gain matrix for the first cell; and selectively moving the first cell to a different node depending on said gain matrix.

2. The method of claim 1 wherein said distributing is accomplished using a greedy algorithm.

3. The method of claim 1 wherein a gain matrix is formed for each possible move of said first cell.

4. The method of claim 3 wherein said selectively moving further comprises:

calculating a value for each of said gain matrices;

selecting a best move cell using said values; and moving said best move cell.

5. The method of claim 4 further comprising the steps of:

before said calculating first gain vector, unlocking all of said cells;

after said moving said best move cell, locking said best move cell; and repeating said calculating first and second gain vectors, said calculating value, said selecting a best move, said moving and said locking until a minimum number of cells are unlocked.

6. The method of claim 5 wherein said mimimum number is zero.

7. The method of claim 4 wherein said value is calculated by summing entries of said gain matrix.

8. The method of claim 4 further comprising:

creating a weight matrix;

multiplying each gain matrix by said weight matrix; and summing entries of said gain matrix to calculate said value.

9. The method of claim 8 further comprising dynamically altering said weight matrix.

10. The method of claim 1 wherein said calculating first and second gain vectors further comprise:

creating a first subgraph comprising nodes from said first level;

calculating said first gain vector according to said first sub graph; and creating a second subgraplh comprising nodes from said second level; and calculating said second gain vector according to said second subgraph.

11. The method of claim 1 wherein said plurality of disjoint blocks are logic array blocks of a programmable logic device.

12. The method of claim 1 wherein said network is a netlist for a programmable logic device.

13. The method of claim 1 wherein said hierarchical graph further comprises a third level, wherein nodes on said third level represent a first set of conductors of a programmable logic device, nodes on said second level represent a second set of conductors of said programmable logic device, nodes on said first level represent a set of logic array blocks of said programmable logic device, and said cells represent logic elements of said programmable logic device.

14. A semiconductor device, said semiconductor device having been partitioned using the method of claim 1.

15. A digital system, said digital system comprising:
    a processing unit; and
    a semiconductor device having been partitioned using the method of claim 1.

16. The method of claim 1 wherein the first node and the second node are distinct nodes.

17. The method of claim 1 wherein the third node and the fourth node are distinct nodes.

18. A method of partitioning a network of cells into a plurality of disjoint blocks of cells comprising:
    representing said network as a hierarchial graph having a first level and a second level;
    distributing said cells to nodes at said first level of said graph to create an initial partiton;
    recording said initial partition as a best partition;
    unlocking each cell;
    calculating a first gain vector for each possible move of each unlocked cell as said first level, the first gain vector representing a cost associated with moving a first cell from a first node at the first level to a second node at the first level;
    calculating a second gain vector for each possible move of each unlocked cell as if the cells were in their respective parent nodes at said second level, the second gain vector repesenting a cost associated with moving the first cell from a third node on the second level to a fourth node on the second level, the first and second gain vectors forming a gain matrix for each unlocked cell;
    calculating a value for each of said gain matrices;
    finding a best move cell using said values, said best move cell representing a best cell that is the most desirable cell to move based on at least one criterion;
    moving said best move cell to create a new partition;
    locking said best move cell;
    repeating said calculating gain vectors, said calculating a value, said finding a move cell, said moving and said locking until a minimum number of cells are locked;
    if said new partition is better than said best partition, then recording said new partition as said best partition.

19. The method of claim 18 wherein said distribution step is accomplished using a greedy algorithm.

20. The method of claim 18 wherein said minimum number is zero.

21. The method of claim 18 wherein said value is calculated by summing entries of said gain matrix.

22. The method of claim 18 further comprising:
    creating a weight matrix;
    multiplying each gain matrix by said weight matrix; and
    summing entries of said gain matrix to calculate said value.

23. The method of claim 22 further comprising dynamically altering said weight matrix.

24. The method of claim 18 wherein said calculating first and second gain vectors further comprise:
    creating a first subgraph comprising nodes from said first level;
    calculating said first gain vector from said first subgraph; and
    creating a second subgraph comprising nodes from said second level; and
    calculating said second gain vector from said second subgraph.

25. A semiconductor device, said semiconductor device having been partitioned using the method of claim 18.

26. A digital system comprising:
    a processing unit; and
    a semiconductor device having been partitioned using the method of claim 18.

27. A computer program product for partitioning a network of cells into a plurality of disjoint blocks, said computer program product embodying computer readable code on a storage medium for causing a processor to:
    represent said network as a hierarchial graph with a plurality of nodes at a first level and a plurality of nodes at a second level, the plurality of nodes at the first level being descendent from the plurality of nodes at the second level; p1 distribute the cells to said plurality of nodes at the first level to form an initial partition.
    calculate a first gain vector for a first cell at said first level, the first gain vector representing a cost associaed wih moving the first cell from a first node of the plurality of nodes at the first level to a second node of the plurality of nodes at the first level;
    calculating a second gain vector for said first cell as if the cells in the plurality of nodes on the first level were in their respective parent nodes at said second level, the second gain vector representing a cost associated with moving the first cell from a third node on the second level to a fourth node at the second level, wherein the first and second gain vectors form a gain matrix for the first cell; and
    selectively move the first cell to a different node depending on said gain matrix.

* * * * *